United States Patent [19]

Ohno

[11] Patent Number: 5,424,690
[45] Date of Patent: Jun. 13, 1995

[54] RING OSCILLATOR CIRCUIT MICROCOMPUTERS AND IC CARDS USING THE SAME

[75] Inventor: Hisashi Ohno, Itami, Japan

[73] Assignee: Mitsubishi Denki Kabushiki Kaisha, Tokyo, Japan

[21] Appl. No.: 268,115

[22] Filed: Jul. 6, 1994

[30] Foreign Application Priority Data

Jul. 15, 1993 [JP] Japan .................... 5-175323

[51] Int. Cl.⁶ .................... H03B 5/24; H03B 5/04; H03K 3/011; H03K 3/027
[52] U.S. Cl. .................... 331/57; 331/153; 331/173; 331/108 C; 331/175
[58] Field of Search .................... 331/1 A, 34, 57, 143, 331/177 R, DIG. 3, 111, 153, 179, 108 C, 173, 175

[56] References Cited

U.S. PATENT DOCUMENTS

| | | | |
|---|---|---|---|
| 4,536,720 | 8/1985 | Cranford, Jr. et al. | 331/57 |
| 4,625,181 | 11/1986 | Bichler | 331/57 |
| 5,081,428 | 1/1992 | Atriss et al. | 331/57 |
| 5,315,166 | 5/1994 | Arimoto | 307/296.2 |

*Primary Examiner*—David Mis
*Attorney, Agent, or Firm*—Leydig, Voit & Mayer

[57] ABSTRACT

An oscillation circuit includes inversion circuits and delay circuits wherein at least one of the inversion circuits includes multiple inverters connected in series to one another and wherein the driving capability of a first stage inverter inserted immediately after the delay circuit at the input of the oscillation circuit is lower than that of a final stage inverter inserted immediately before the delay circuit at the output of the oscillation circuit.

8 Claims, 4 Drawing Sheets

RING OSCILLATOR CIRCUIT MICROCOMPUTERS AND IC CARDS USING THE SAME

BACKGROUND OF THE INVENTION

1. Field of the Invention

The present invention generally relates to an oscillation circuit which is used in microcomputers, IC cards and the like. More particularly, the invention is concerned with an oscillation circuit which can operate stably over an extended range of operating voltages. With the term "microcomputer", it is contemplated to mean small computer system and cover small business or office computers and personal computers. Further, the "IC card" covers those typified by chip card, intelligent card, smart card and the like.

2. Description of Related Art

Heretofore, the microcomputers and the devices mentioned above have been designed to operate with a single operating voltage usually standardized to 5 volts. In that case, it is sufficient for the oscillation circuit incorporated in the microcomputers to operate with a single operating voltage. In recent years, however, there increasingly arose a demand for battery-driven microcomputers such as notebook-size personal computers, handy-type terminals and the like, which in turn requires oscillation circuits which are capable of operating at various voltages within a wide voltage range. However, broadening of the operating voltage range of the oscillation circuit is accompanied with problems to be Solved, which will be explained below in conjunction with a typical one of the conventional oscillation circuits.

FIG. 6 is a diagram showing an oscillation circuit known heretofore which is used in a charge pump for internally generating voltage signals to be supplied to a UART (Universal Asynchronous Receiver/Transmitter), an EEPROM (Electrically Erasable and Programmable Read-Only Memory) and others incorporated in microcomputers, IC cards and other elements. Referring to FIG. 6, the oscillation circuit includes a NAND circuit 1 having first and second input terminals, a first inverter 2 having an input terminal to which the output terminal of the NAND circuit 1 is connected and an output terminal connected to one end of a first capacitor 4 via a first resistor 3. The other end of the first capacitor 4 is grounded. A junction (i.e., node of connection) between the first resistor 3 and the first capacitor 4 is connected to an input terminal of a second inverter 5 which has an output terminal connected to one end of a second capacitor 7 via a second resistor 6. The other end of the second capacitor 7 is grounded. A junction between the second resistor 6 and the second capacitor 7 is connected to an output terminal 8 of the oscillation circuit on one hand and connected to the second input terminal of the NAND circuit 1 on the other hand. The first input terminal of the NAND circuit 1 is connected to an input terminal 9 of the oscillation circuit. Parenthetically, the first inverter 2, the first resistor 3 and the first capacitor 4 constitute one circuit unit 10a, while the another circuit unit 10b is constituted by the second inverter 5, the second resistor 6 and the second capacitor 7. Of course, more than two circuit units of the same configuration as the circuit units 10a and 10b may be connected in cascade, if desired.

As a trigger signal for triggering operation of the oscillation circuit, an enable signal EN is supplied to the first input terminal of the NAND circuit 1 from a CPU (Central Processing Unit) or the like incorporated in the microcomputer or IC card. When the enable signal EN is fixed to a low level (L), the output of the NAND circuit 1 takes on a high level (H). This high-level output of the NAND circuit 1 is transmitted to the output terminal 8 via a series connection of the first inverter 2 and the first resistor 3 as well as the second inverter 5 and the second resistor 6 connected in series. Thus, an output signal OUT of high level (H) appears at the output terminal 8 of the oscillation circuit. This output signal OUT is fed back to the second input terminal of the NAND circuit 1. However, because the enable signal EN applied to the first input terminal of the NAND circuit 1 is fixed at the low level, the output of the NAND circuit 1 remains constantly at the high level.

When the enable signal EN is changed from the low level to the high level, the output of the NAND circuit 1 changes from the high to the low level, which results in change of the output signal OUT at the output terminal 8 to the low level from the high level. At this time, the feedback signal applied to the second input terminal of the NAND circuit 1 becomes low. Consequently, the output of the NAND circuit 1 becomes high with the result that the level of the output signal OUT at the output terminal 8 is also high. Through repetition of the operation described above, there takes place oscillation in the oscillation circuit, wherein the oscillation frequency is determined by a time constant which in turn is determined by the values of the first resistor 3, the second resistor 6, the first capacitor 4 and the second capacitor 7. FIG. 7 shows a waveform of the oscillation signal output from the output terminal 8. The curvilinear rising edges and falling edges of the pulse-like waves depend on the time constant mentioned above. In order to allow the periodic signal generated by the oscillation circuit to be utilized as a clock signal, the signal will have to be shaped by a suitable shaper circuit.

The prior art oscillation circuit described above suffers a problem that because each of the circuit units 10a and 10b includes a single inverter (2 or 5), the oscillation frequency characteristics of the oscillation circuit depend on the driving capability of the first inverter 2 or the second inverter 5 to a great extent. With the phrase "driving capability" used herein, it is contemplated to mean a parameter indicating magnitude of a current which can be driven by the inverter. Since the inverter is constituted by an N-channel transistor and a P-channel transistor, the driving capability of the former is determined by that of the latter.

As mentioned previously, in the prior art oscillation circuit, the frequency of oscillation depends on a time constant (a delay factor) which in turn is determined by values of the resistor (3, 6) and the capacitor (4, 7) connected to the inverter (2, 5). Besides, the transistor itself which constitutes the inverter (2, 5) has a resistance component (internal resistance) which bears such a relation to the driving capability of the inverter (2, 5) that the internal resistance assumes a smaller value as the driving capability becomes greater and vice versa.

For the reasons mentioned above, if the driving capability of the inverters 2 and 5 is low when a wide range of operating voltage ranging from about 2.7 to 5.5 volts is to be ensured for the oscillation circuit, the influence of the internal resistance of the transistors constituting the inverter becomes significant and broadens the waveform of the output signal of the oscillation circuit (i.e., the time taken for the rising and falling of the pulse is increased), which results in that the oscillation frequency deviates from a preset value to a lower frequency. On the other hand, when the driving capability of the inverters 2 and 5 are enhanced, the broadening of the waveform (and hence deviation from the preset frequency) can certainly be mitigated. However, in that case, power consumption of the inverters and hence the oscillation circuit increases, giving rise to a problem.

SUMMARY OF THE INVENTION

In the light of the state of the art described above, it is therefore an object of the present invention is to solve the problems of the oscillation circuit known heretofore and provide to this end a novel and improved oscillation circuit which can enjoy an extended or enlarged range of operating voltages without increasing power consumption and without change or variation in the output frequency of the oscillation circuit.

Another object of the present invention is to provide a computer system which includes as a part of a clock signal generating means an oscillation circuit of the type mentioned above.

A further object of the invention is to provide an IC card device which includes as a part of a clock signal generating means an oscillation circuit of the type mentioned above.

In view of the above and other objects which will become apparent as description proceeds, there is provided according to a first aspect of the present invention an oscillation circuit which comprises a plurality of inversion circuits, and a plurality of delay circuits, wherein at least one of the inversion circuits is constituted by a plurality of inverters connected in series to one another, and wherein the driving capability of a first stage inverter of the plural inverters which is inserted immediately after the delay circuit disposed at the input side of the oscillation circuit is lower than that of a final stage inverter inserted immediately before the delay circuit disposed at thee output side of the oscillation circuit.

With the arrangement of the oscillation circuit described above, the power consumption can effectively be prevented from increasing because the magnitude of a through-current can be decreased by lowering the driving capability of the first stage inverter for which the input signal has a broadened waveform. Further, by enhancing the driving capability of the final stage inverter for which the input signal rises and falls sharply, the influence of the internal resistance on the time constant can be minimized, whereby the oscillation frequency can be prevented from variation or fluctuation. Thus, there can be realized an oscillation circuit which can operate stably over a wide range of voltages.

Further, according to a second aspect of the present invention, there is provided an oscillation circuit which comprises a NAND circuit having a first input terminal to which a trigger signal is externally applied, a first inversion circuit for inverting an output signal of the NAND circuit, a first delay circuit for integrating an output signal of the first inversion circuit, at least one second inversion circuit for inverting and amplifying an output signal of the first delay circuit, and at least one second delay circuit for integrating an output signal of the second inversion circuit, wherein an output of the second delay circuit being fed back is applied to a second input terminal of the NAND circuit, wherein at least one second inversion circuit mentioned above includes a plurality of inverters connected in series to one another, and wherein the driving capability of a first stage inverter of the plural inverters which is inserted immediately after the first delay circuit is lower than that of a final stage inverter inserted immediately before the second delay circuit.

By virtue of the arrangement of the oscillation circuit mentioned above, there can be achieved advantageous effects similar to those mentioned above in conjunction with oscillation circuit according to the first aspect of the present invention.

In the case of the oscillation circuits having the structures mentioned above, unwanted events such as nonoccurrence of oscillation may undesirably occur, if a difference in the driving capability between the first stage inverter and the final stage inverter is excessively large. Accordingly, in a preferred mode for carrying out the invention, the second inversion circuit mentioned adore may include at least one intermediate stage inverter connected between the first stage inverter and the final stage inverter, wherein driving capability of the intermediate stage inverter is higher than that of the first stage inverter and lower than that of the final stage inverter. By virtue of provision of the intermediate stage inverter, a more stable operation of the oscillation circuit can be ensured.

In another preferred mode for carrying out the invention, the second inversion circuit previously mentioned may include a plurality of intermediate stage inverters connected in series between the first stage inverter and the final stage inverter, wherein driving capabilities of the plurality of intermediate stage inverters are progressively and sequentially increased, starting from the one connected immediately after the first stage inverter toward the final stage inverter.

By providing a plurality of intermediate stage inverters, even a large difference in the driving capability between the first and final stage inverters can adequately be accommodated, whereby operation of the oscillation circuit can to be further stabilized over an extended range of operating voltages.

The above and other objects, features and attendant advantages of the present invention will more easily be understood by reading the following description of the preferred embodiments thereof taken, only by way of example, in conjunction with the drawings.

DESCRIPTION OF THE PREFERRED EMBODIMENTS

Now, the present invention will be described in detail in conjunction with preferred or exemplary embodiments thereof by reference to the drawings.

Figure 1:
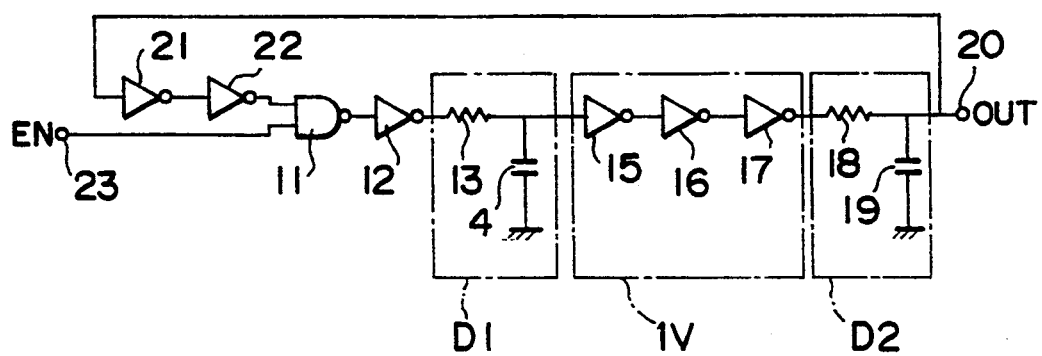
FIG. 1 is a circuit diagram showing a configuration of an oscillation circuit according to an embodiment of the present invention.

FIG. 1 is a circuit diagram showing a configuration of an oscillation circuit according to an embodiment of the present invention for incorporation in microcomputers, IC cards or the like.

Referring to FIG. 1, a NAND circuit 11 has two input terminals, a first terminal of which is connected to an input terminal 23 of the oscillation circuit. A trigger signal generated by a CPU (Central Processing Unit) incorporated in a microcomputer, an IC card or the like is input to the input terminal 23 as an enable signal EN for triggering operation of the oscillation circuit. The NAND circuit 11 has an output terminal connected to an input terminal of a first delay circuit D1 via a first inverter 12 which serves as a first inversion circuit. The output terminal of the first delay circuit D1 is connected to an input terminal of a second inversion circuit IV having an output terminal connected to an input terminal of a second delay circuit D2.

The first delay circuit D1 includes a first resistor 13 having one end connected to the output terminal of the first inverter 12 and a first capacitor 14 having one end connected to the other end of the first resistor 13. The other end of the capacitor 14 is grounded. A junction (i.e., connecting node or point) between the first resistor 13 and the first capacitor 14 is connected to the input terminal of the second inversion circuit IV.

The second inversion circuit IV includes a second inverter 15 as a first stage inverter, a third inverter 16 as an intermediate stage inverter and a fourth inverter 17 serving as a final stage inverter, wherein the input terminal of the second inverter 15 is connected to the junction between the first resistor 13 and the first capacitor 14.

On the other hand, the second delay circuit D2 includes a second resistor 18 having one end connected to the output terminal of the fourth inverter 17 and a second capacitor 19 having one end connected to the other end of the second resistor 18. The other end of the capacitor 19 is connected to the ground. A junction between the second resistor 18 and the second capacitor 19 is connected to the output terminal 20 of the oscillation circuit for generating an output signal which can be utilized as a clock signal for a UART (Universal Asynchronous Receiver/Transmitter), an EEPROM (Electrically Erasable and Programmable Read-Only Memory) and other elements incorporated in the microcomputer, IC card or the like. Additionally, the junction between the second resistor 18 and the second capacitor 19 is connected to a second input terminal of the NAND circuit 11 via fifth and sixth inverters 21 and 22 connected in series.

Figure 2:
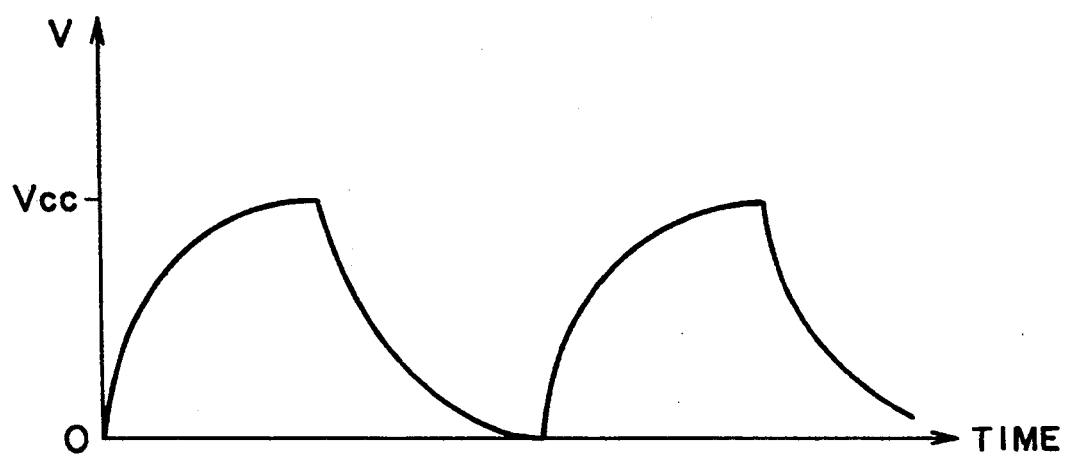
FIG. 2 is a waveform diagram showing a waveform of an input signal for illustrating operation of the oscillation circuit shown in FIG. 1.
Figure 3:
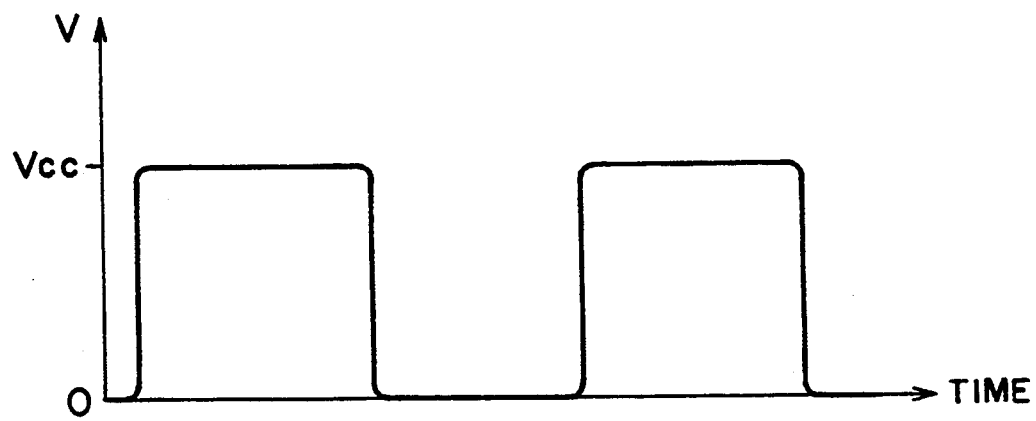
FIG. 3 is a waveform diagram showing a waveform of an output signal for illustrating operation of the oscillation circuit shown in FIG. 1.

FIG. 2 is a waveform diagram showing a waveform of the enable signal EN supplied to the first inverter 12 from a CPU of a microcomputer, IC card or the like, and FIG. 3 is a waveform diagram showing a waveform of an output signal OUT generated by the second delay circuit D2.

Figure 4:
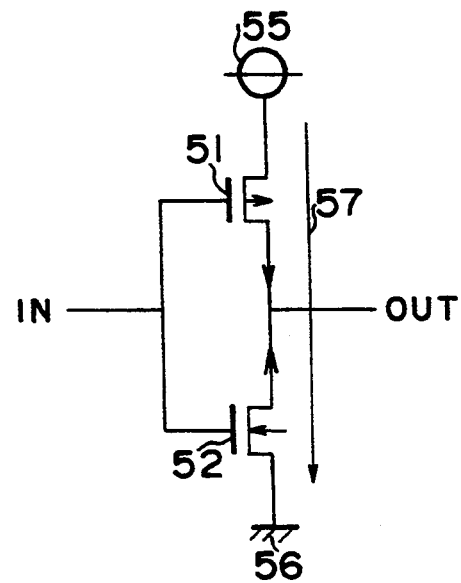
FIG. 4 is a circuit diagram showing a typical structure of an inverter employed in the oscillation circuit.

FIG. 4 is a circuit diagram showing a typical structure of the inverter 15, 16 or 17 shown in FIG. 1. As can be seen from the figure, the inverter is realized in the form of a CMOS (Complementary Metal-Oxide Semiconductor) device in which a P-type transistor 51 and an N-type transistor 52 are connected in a complementary manner. More specifically, the P-type transistor 51 and the N-type transistor 52 have respective bases which are interconnected so as to form an input terminal (IN). The P-type transistor 51 has an emitter connected to a power source 55, while the N-type transistor 52 has a collector connected to the ground potential. The collector of the P-type transistor 51 and the emitter of the N-type transistor 52 are connected together to form an output terminal (OUT).

In operation, when the input signal applied to the bases of the P-type transistor 51 and the N-type transistor 52 changes from a low level to a high level, the N-type transistor 52 becomes conducting, which is followed by turn-off of the P-type transistor 51 (i.e., switching of the P-type transistor 51 to the non-conducting state). In this conjunction, it should, however, be noted that both of the transistors 51 and 52 temporarily or transiently assume the conducting state simultaneously during a period in which the input signal changes from the low level to the high level. As a consequence, a through-current (which may also be referred to as the rush current) flows from the power source 52 to the ground 56 (i.e., in the direction indicated by an arrow 57) via the P-type transistor 51 and the N-type transistor 52. Similarly, upon changing of the input signal from the high level to the low level, the P-type transistor 51 is first turned on and then the N-type transistor 52 is turned off. Consequently, during a period in which the input signal falls from the high level to the low level, both of the P-type transistor 51 and the N-type transistor 52 are temporarily set to the conducting state to allow the through-current to flow from the power source 55 to the ground 56.

Figure 5:
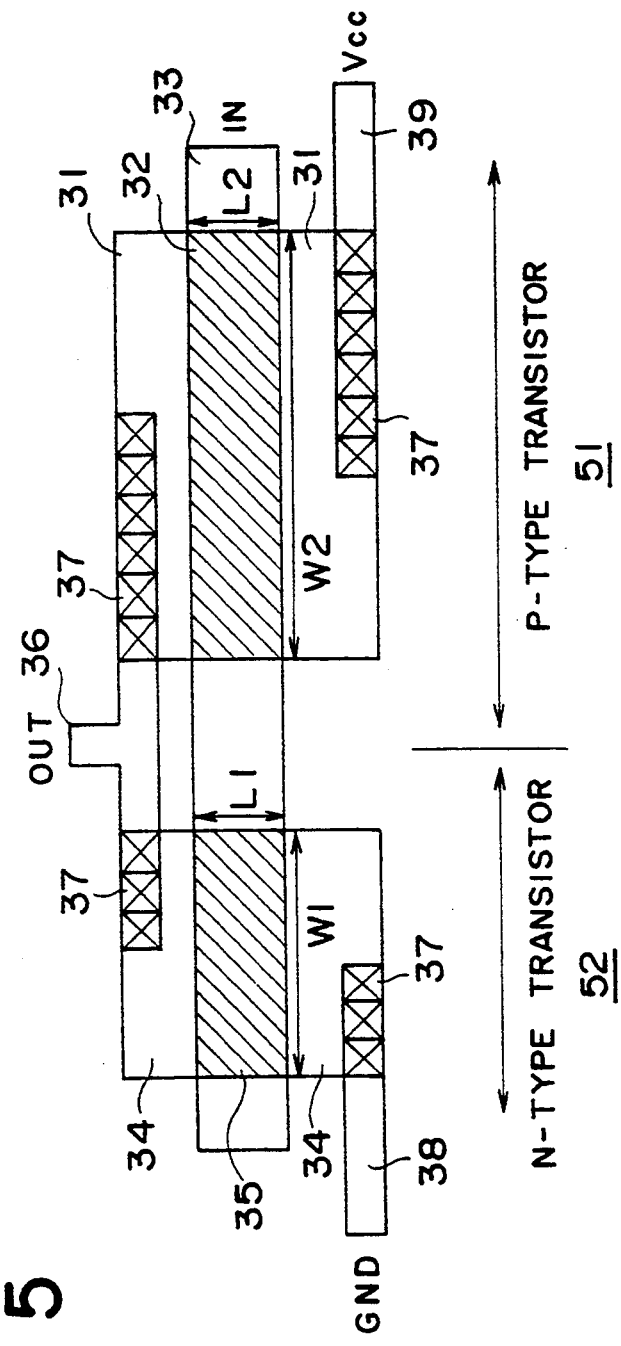
FIG. 5 is a pattern diagram for illustrating a physical structure of the inverter shown in FIG. 4.

FIG. 5 is a diagram for illustrating a physical structure of the inverter shown in FIG. 4. Referring to the figure, the P-type transistor 51 has a field region 31, a gate region 32 and a signal input region 33. Similarly, the N-type transistor 52 has a field region 34 and a gate region 35. Aluminum wires 36, 38 and 39 are connected to the output terminal, the ground and the power source, respectively. Contact regions 37 are provided for making electrical contacts between the aluminum wires 36, 38 and 39 and the fields 31 and 32, respectively.

Figure 6:
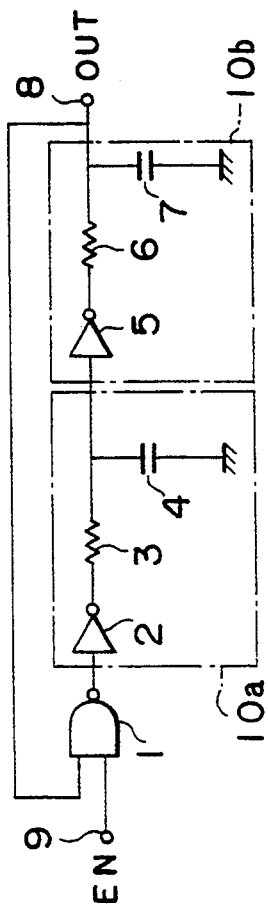
FIG. 6 is a diagram showing an oscillation circuit known heretofore.
Figure 7:
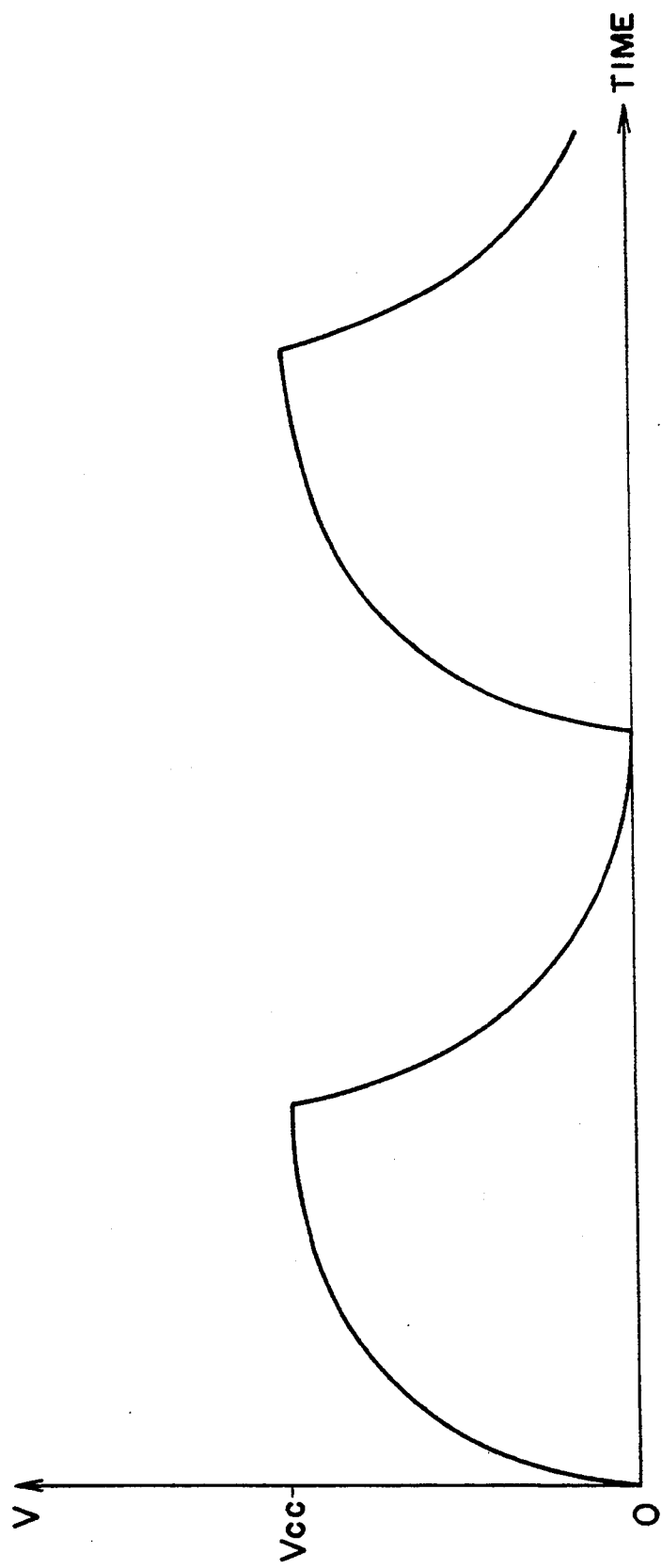
FIG. 7 is a waveform diagram showing an oscillation signal output from an output terminal for illustrating operation of the conventional oscillation circuit shown in FIG. 1.

Now, operation of the oscillation circuit according to the instant embodiment of the invention will be described in detail. The mechanism itself for causing the oscillation to take place is essentially same as that of the conventional oscillation circuit described hereinbefore by reference to FIG. 6. In other words, so long as the enable signal EN applied to the first input terminal of the NAND circuit 11 as the trigger signal is fixed to the low level, the output signal OUT appearing at the output terminal 20 continues to remain at the high level, causing no oscillation. However, when the enable signal EN is changed from the low level to the high level and fixed at the high level, oscillation takes place in the output signal OUT in the manner described hereinbefore in conjunction with the convention oscillation circuit.

The input signal for the second inverter 15 disposed at the input side of the second inversion circuit IV, the so-called first stage inverter, is caused to flow through the first delay circuit D1 constituted by the first resistor 13 and the first capacitor 14 before being input to the second inverter 15 and thus broadened in the waveform, as illustrated in FIG. 2. Consequently, if the driving capability of the second inverter 15 is enhanced, the period during which both the P-type transistor 51 and the N-type transistor 52 of the second inverter 15 are simultaneously in the conducting state is elongated, as a result of which the temporal period during which the through-current flows from the power source 55 to the ground 51 is extended, thus increasing the power consumption. In contrast, the waveform of the signal input to the fourth inverter 17 corresponding to the final stage inverter provided at the output side is not broadened (i.e., this pulse signal has sharp or steep rise-up edge and falling edge). Accordingly, an increase or enhancement of the driving capability of the fourth inverter 17 is not accompanied with any appreciable increase in the duration of the through-current and hence in the power consumption.

As mentioned previously, the driving capability of each of the inverters 15 to 17 is determined by the driving capabilities of the P-type transistor 51 and the N-type transistor 52 of the inverter. In this conjunction, the driving capability $\beta$ of each of these transistors is given by the following expression:

$$\beta = P \cdot W/L$$

where P represents a constant determined by various parameters (temperature, manufacturing process, material, impurity concentration, thickness of gate oxide film, dielectric constant, etc.) in semiconductor manufacturing processes, L represents the length of the gate of the transistor, and W represents the width of the same. Thus, it can be seen that the driving capability of the transistor depends on the ratio between the width W and the length L of the gate, i.e., W/L. More specifically, the driving capability of the inverter including the P-type transistor 51 and the N-type transistor 52 as shown in FIG. 5 increases as the lengths L1 and L2 of the gates of the P-type transistor 51 and the N-type transistor 52, respectively, become shorter and/or as the widths W1 and W2 of the N-type transistor 52 and the P-type transistor 51, respectively, become larger.

Further, the magnitude of the current flowing through the transistors 51 and 52 increases as the input voltage becomes higher and vice versa. In other words, as the input voltage becomes higher, the driving capabilities of the transistors 51 and 52 are increased (with the internal resistance being decreased) and vice versa. This means that as the input voltage to the inverter immediately preceding the second delay circuit D2 becomes lower, the output frequency of the second delay circuit D2 becomes lower. Thus, by increasing sufficiently the driving capability of the fourth inverter 17 disposed immediately before the second delay circuit D2, lowering of the output frequency of the second delay circuit D2 can be suppressed to a negligible degree, whereby variation or fluctuation of the oscillation frequency can be satisfactorily suppressed.

For the reasons described before, in the oscillation circuit according to the instant embodiment of the present invention, the driving capability of the second inverter 15 including a first stage inverter disposed at the input side of the second inversion circuit IV is reduced because it is sufficient for the second inverter 15 to drive only the third inverter 16, while the driving capability of the fourth inverter 17, the final stage inverter, is increased, whereby the influence of the internal resistance which affects the time constant of the oscillation circuit is minimized. Thus, deviation of the oscillation frequency from the preset frequency can be effectively avoided even when the overall driving capability of the second inversion circuit IV is set to be low, while the power consumption can profitably be prevented from increasing even when the overall driving capability of the second inversion circuit IV is high. In this manner, there can be ensured highly stable operation of the oscillation circuit over a wide voltage range from about 2.7 volts to 5.5 volts while effectively decreasing the power consumption.

When the driving capability of the second inverter 15 in the first stage is lowered and that of the fourth inverter 17 of the final stage is increased, a difference arises in the driving capability between the second inverter 15 and the fourth inverter 17. If this difference is excessively large, the fourth inverter 17 of final stage may fail to drive the current satisfactorily, which may eventually lead to no oscillation. Such an unwanted situation can be avoided by providing the third inverter 16 as an intermediate stage inverter and selecting the driving capability of the third inverter 16 to be higher than that of the second inverter 15 and lower than that of the fourth inverter 17. The number of the intermediate stage inverters may be increased, as occasion requires. In that case, however, the number of the inverter elements (inclusive of the NAND circuit) in the oscillation circuit as a whole should be selected to be an odd number, because, otherwise, no oscillation can take place.

In the case of the oscillation circuit illustrated in FIG. 1, only one inverter 16 is provided as the intermediate stage inverter of the second inversion circuit IV. In this conjunction, it should be noted that a plurality of intermediate stage inverters which differ from one another in respect to the driving capability may be connected in series between the first stage inverter 15 and the final stage inverter 17. In that case, the driving capabilities of these plural intermediate stage inverters should preferably decrease progressively and sequentially from the inverter disposed immediately after the first stage inverter 15 toward the inverter disposed immediately before the final stage inverter 17. Owing to such arrangement, a significant difference in the driving capability between the first stage inverter 15 and the final stage inverter 17 can be stepwise and smoothly be accommodated by the plural intermediate stage inverters.

Many features and advantages of the present invention are apparent form the detailed specification and thus it is intended by the appended claims to cover all such features and advantages of the system which fall within the true spirit and scope of the invention. Further, since numerous modifications and changes will readily occur to those skilled in the art, it is not desired to limit the invention to the exact construction and operation illustrated and described.

By way of example, in the oscillation circuit shown in FIG. 1, the second inversion circuit IV is a plurality of inverters 15 to 17. It is, however, to be added that the first inversion circuit 12 may equally be a plurality of inverters. Further, the second inversion circuit IV and the second delay circuit D2 may be provided in pluralities, respectively. Besides, it should be appreciated that the oscillation circuit according to the invention is never limited to any particular utilization but may find a great variety of applications covering not only the existing microcomputers and IC cards but also those which will be developed in the future. Accordingly, the terms "microcomputer", "IC card" or "computer system" used herein should be interpreted in their broadest sense. Thus, it should be understood that all suitable modifications and equivalents to, falling within the scope of the invention may be resorted to.

I claim:

1. An oscillation circuit comprising:
   a plurality of inversion circuits; and
   a plurality of delay circuits, wherein at least one of said inversion circuits is a plurality of inverters connected in series to one another and wherein driving capability of a first stage inverter of said plurality of inverters inserted immediately after the delay circuit at an input of said oscillation circuit is lower than that of a final stage inverter inserted immediately before the delay circuit at an output of said oscillation circuit.

2. An oscillation circuit comprising:
   a NAND circuit having a first input terminal for receiving a trigger signal;
   a first inversion circuit for inverting an output signal of said NAND circuit;
   a first delay circuit for integrating an output signal of said first inversion circuit;
   at least one second inversion circuit for inverting and amplifying an output signal of said first delay circuit; and
   at least one second delay circuit for integrating an output signal of said second inversion circuit, an output of said second delay circuit being fed back to a second input terminal of said NAND circuit, wherein said at least one second inversion circuit includes a plurality of inverters connected in series to one another and wherein driving capability of a first stage inverter of said plurality of inverters inserted immediately after said first delay circuit is lower than that of a final stage inverter inserted immediately before said second delay circuit.

3. An oscillation circuit according to claim 2, wherein said at least one second inversion circuit includes at least one intermediate stage inverter connected between said first stage inverter and said final stage inverter and wherein the driving capability of said intermediate stage inverter is higher than that of first stage inverter and lower than that of said final stage inverter.

4. An oscillation circuit according to claim 3, wherein said at least one second inversion circuit includes a plurality of intermediate stage inverter connected in series between said first stage inverter and said final stage inverter and wherein the driving capabilities of said plurality of intermediate stage inverters progressively and sequentially increase from the intermediate stage inverter connected immediately after said first stage inverter toward said final stage inverter.

5. A computer system comprising clock signal generating means including an oscillation circuit triggered by a signal generated in said computer system, said oscillation circuit comprising:
   a plurality of inversion circuits; and
   a plurality of delay circuits, wherein at least one of said inversion circuits is a plurality of inverters connected in series to one another and wherein driving capability of a first stage inverter of said plurality of inverters immediately after the delay circuit at an input of said oscillation circuit is lower than that of a final stage inverter inserted immediately before the delay circuit at an output of said oscillation circuit.

6. A computer system comprising clock signal generating means including an oscillation circuit triggered by a signal generated in said computer system, said oscillation circuit comprising:
   a NAND circuit having a first input terminal for receiving a trigger signal;
   a first inversion circuit for inverting an output signal of said NAND circuit;
   a first delay circuit for integrating an output signal of said first inversion circuit;
   at least one second inversion circuit for inverting and amplifying an output signal of said first delay circuit; and
   at least one second delay circuit for integrating an output signal of said second inversion circuit, an output of said second delay circuit being fed back to a second input terminal of said NAND circuit, wherein said at least one second inversion circuit includes a plurality of inverters connected in series to one another and wherein driving capability of a first stage inverter of said plurality of inverters inserted immediately after said first delay circuit is lower than that of a final stage inverter inserted immediately before said second delay circuit.

7. An IC card device comprising clock signal generating means including an oscillation circuit, said oscillation circuit comprising:
   a plurality of inversion circuits; and
   a plurality of delay circuits, wherein at least one of said inversion circuits is a plurality of inverters connected in series to one another and wherein driving capability of a first stage inverter of said plurality of inverters inserted immediately after the delay circuit at an input of said oscillation circuit is lower than that of a final stage inverter inserted immediately before the delay circuit at an output of said oscillation circuit.

8. An IC card device comprising clock signal generating means including an oscillation circuit, said oscillation circuit comprising:
   a NAND circuit having a first input terminal for receiving a trigger signal;
   a first inversion circuit for inverting an output signal of said NAND circuit;
   a first delay circuit for integrating an output signal of said first inversion circuit;
   at least one second inversion circuit for inverting and amplifying an output signal of said first delay circuit; and
   at least one second delay circuit for integrating an output signal of said second inversion circuit, an output of said second delay circuit being fed back to a second input terminal of said NAND circuit, wherein said at least one second inversion circuit includes a plurality of inverters connected in series to one another and wherein driving capability of a first stage inverter of said plurality of inverters inserted immediately after said first delay circuit is lower than that of a final stage inverter inserted immediately before said second delay circuit.

* * * * *